United States Patent
Lin et al.

(10) Patent No.: US 10,923,455 B2
(45) Date of Patent: *Feb. 16, 2021

(54) SEMICONDUCTOR APPARATUS AND METHOD FOR PREPARING THE SAME

(71) Applicant: NANYA TECHNOLOGY CORPORATION, New Taipei (TW)

(72) Inventors: Po-Chun Lin, Changhua (TW); Chin-Lung Chu, Taoyuan (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/209,540

(22) Filed: Dec. 4, 2018

(65) Prior Publication Data

US 2019/0109113 A1    Apr. 11, 2019

Related U.S. Application Data

(62) Division of application No. 15/853,435, filed on Dec. 22, 2017, now abandoned, which is a division of
(Continued)

(51) Int. Cl.
*H01L 21/768* (2006.01)
*H01L 23/00* (2006.01)
(Continued)

(52) U.S. Cl.
CPC ........ *H01L 24/83* (2013.01); *H01L 21/30625* (2013.01); *H01L 21/324* (2013.01);
(Continued)

(58) Field of Classification Search
CPC ......... H01L 24/29; H01L 24/32; H01L 24/83; H01L 24/05; H01L 24/08; H01L 24/80;
(Continued)

(56) References Cited

U.S. PATENT DOCUMENTS 9,123,785 B1 * 9/2015 Duong ................ H01L 23/5283
2012/0252189 A1   10/2012 Sadaka et al.
(Continued)

FOREIGN PATENT DOCUMENTS

CN    102891091 A    1/2013
CN    108140559 A    6/2018

OTHER PUBLICATIONS

Office Action dated Sep. 9, 2019 in U.S. Appl. No. 16/119,572.
(Continued)

*Primary Examiner* — Thanhha S Pham
(74) *Attorney, Agent, or Firm* — Muncy, Geissler, Olds & Lowe, P.C.

(57) ABSTRACT

The present disclosure is directed to a method for preparing a semiconductor apparatus having a plurality of bonded semiconductor devices formed by a fusion bonding technique and a method for preparing the same. The method includes the steps of forming a first semiconductor device having a first conductive portion, a first dielectric portion adjacent to the first conductive portion, and a depression at an upper surface of the first conductive portion; forming a second semiconductor device having a second conductive portion and a second dielectric portion adjacent to the second conductive portion; disposing the first semiconductor device and the second semiconductor device in a manner such that the first conductive portion faces the second conductive portion; and expanding at least one of the first conductive portion and the second conductive portion to fill the depression.

4 Claims, 13 Drawing Sheets

Related U.S. Application Data application No. 15/434,606, filed on Feb. 16, 2017, now abandoned.

(51) Int. Cl.
*H01L 23/532* (2006.01)
*H01L 23/522* (2006.01)
*H01L 21/324* (2006.01)
*H01L 21/306* (2006.01)

(52) U.S. Cl.
CPC .... *H01L 21/76877* (2013.01); *H01L 23/5226* (2013.01); *H01L 23/53228* (2013.01); *H01L 24/03* (2013.01); *H01L 24/05* (2013.01); *H01L 24/08* (2013.01); *H01L 24/80* (2013.01); H01L 2224/039 (2013.01); H01L 2224/0347 (2013.01); H01L 2224/0361 (2013.01); H01L 2224/0384 (2013.01); H01L 2224/03612 (2013.01); H01L 2224/03614 (2013.01); H01L 2224/05557 (2013.01); H01L 2224/05571 (2013.01); H01L 2224/05578 (2013.01); H01L 2224/05647 (2013.01); H01L 2224/05687 (2013.01); H01L 2224/08145 (2013.01); H01L 2224/08147 (2013.01); H01L 2224/80035 (2013.01); H01L 2224/80357 (2013.01); H01L 2224/80801 (2013.01); H01L 2224/80895 (2013.01); *H01L 2224/80896* (2013.01); *H01L 2224/80935* (2013.01); *H01L 2224/80986* (2013.01)

(58) Field of Classification Search
CPC ... H01L 2224/8034; H01L 2224/80001; H01L 21/768; H01L 21/76802
See application file for complete search history.

(56) References Cited

U.S. PATENT DOCUMENTS

| | | |
|---|---|---|
| 2013/0020704 A1 | 1/2013 | Sadaka |
| 2014/0015088 A1 | 1/2014 | Chapelon |
| 2015/0097022 A1 | 4/2015 | Di Cioccio et al. |
| 2015/0255340 A1 | 9/2015 | Duong et al. |
| 2016/0155724 A1 | 6/2016 | Kim et al. |
| 2018/0374818 A1* | 12/2018 | Lin .................. H01L 24/05 |

OTHER PUBLICATIONS

United States Patent and Trademark Office, Office Action in U.S. Appl. No. 15/853,435, Jan. 25, 2019, 9 pages.

Di Cioccioa et al., "An Overview of Patterned Metal/ Dielectric Surface Bonding: Mechanism, Alignment and Characterization, ECS Transactions", 33 (4) 3-16 (2010).

\* cited by examiner

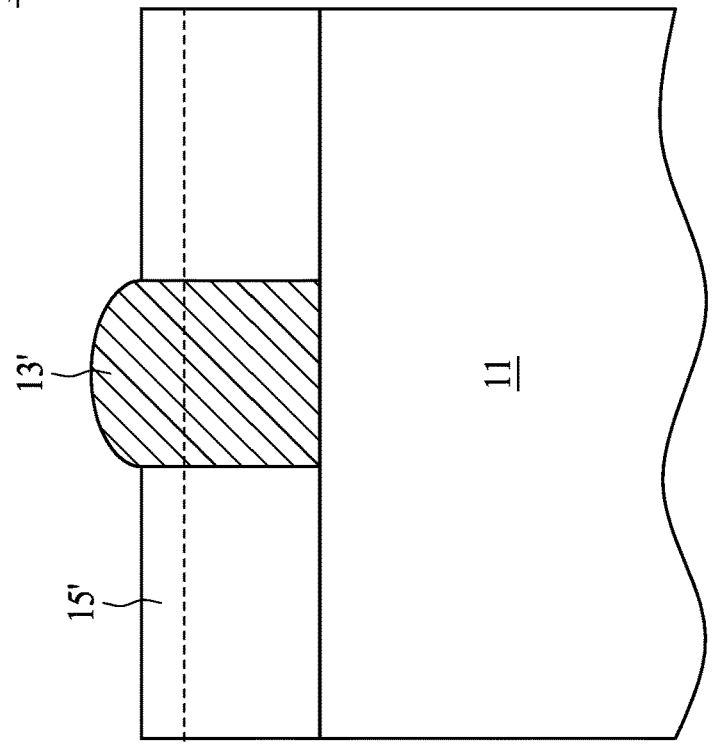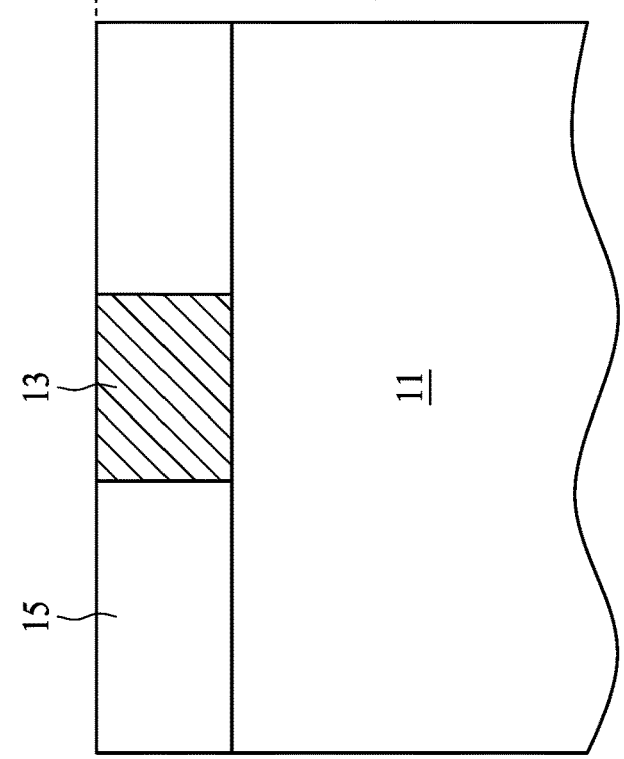
FIG. 1

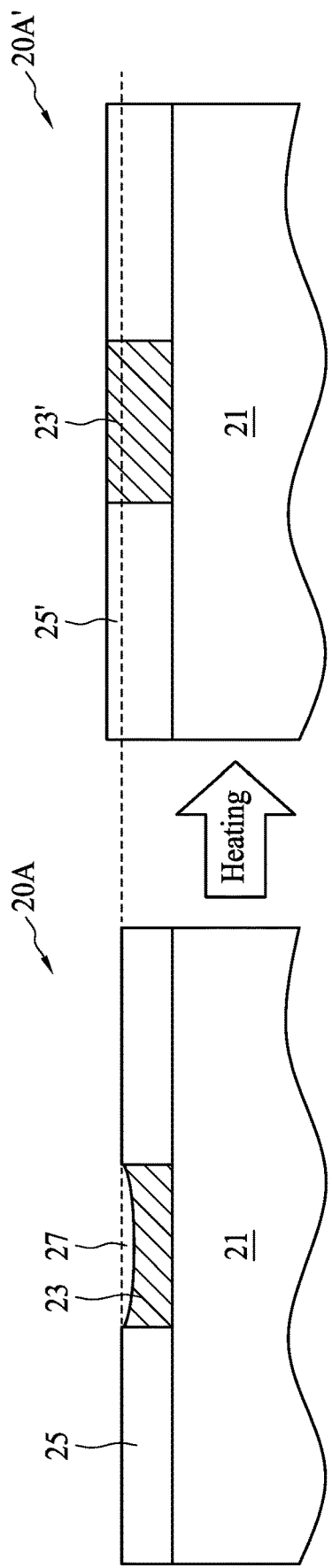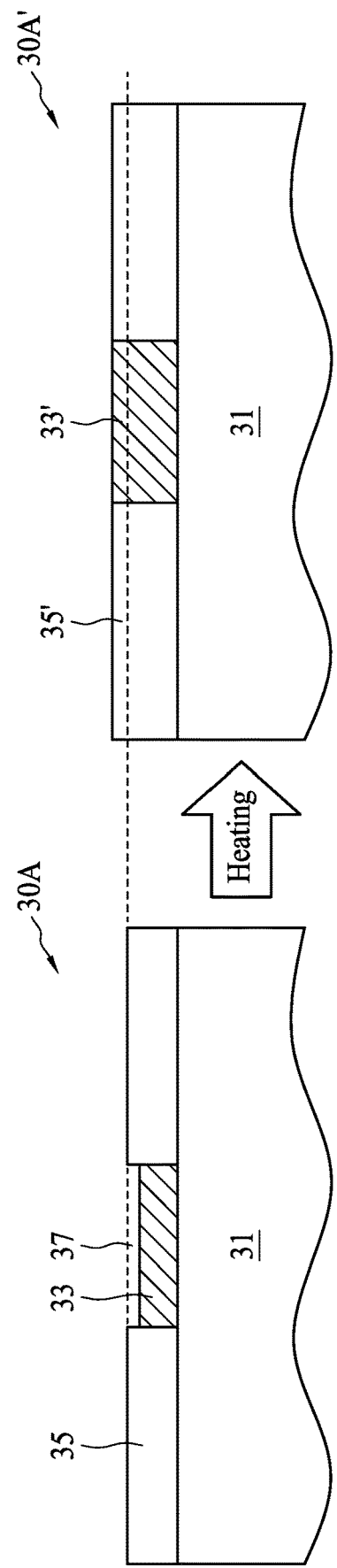
FIG. 3
FIG. 4

SEMICONDUCTOR APPARATUS AND METHOD FOR PREPARING THE SAME

PRIORITY CLAIM AND CROSS-REFERENCE

This application is a divisional application of U.S. patent application Ser. No. 15/853,435, filed on Dec. 22, 2017, which is a divisional application of U.S. patent application Ser. No. 15/434,606, filed on Feb. 16, 2017. The entireties of the above-mentioned patent applications are hereby incorporated by reference herein and made a part of this specification.

TECHNICAL FIELD

The present disclosure relates to a semiconductor apparatus and a method for preparing the same, and particularly relates to a semiconductor apparatus having a plurality of bonded semiconductor devices formed by a fusion bonding technique and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor devices. Numerous manufacturing processes such as epitaxial growing process or post via formation are undertaken in the production of such semiconductor packages.

However, the manufacturing of semiconductor devices in a miniaturized scale is becoming more complicated. An increase in the complexity of manufacturing semiconductor devices may cause deficiencies such as poor electrical interconnection, development of cracks, or delamination of components. As such, there are many challenges for modifying the structure and manufacture of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One embodiment of the present disclosure provides a semiconductor apparatus including a first semiconductor device having a first conductive portion, a first dielectric portion adjacent to the first conductive portion, and a depression above an upper surface of the first conductive portion, wherein a coefficient of thermal expansion of the first conductive portion is higher than that of the first dielectric portion, and a volume of the depression is substantially the same as a volume expansion of the first conductive portion from a first temperature to a second temperature higher than the first temperature.

In some embodiments, an upper end of the first conductive portion is lower than that of the first dielectric portion.

In some embodiments, a thickness of the first conductive portion is less than that of the first dielectric portion.

In some embodiments, the semiconductor apparatus further comprises a second semiconductor device having a second conductive u) portion and a second dielectric portion adjacent to the second conductive portion, wherein the first conductive portion faces the second conductive portion, the depression separates the first conductive portion from the second conductive portion, and the first dielectric portion contacts the second dielectric portion.

In some embodiments, a center of the first conductive portion is aligned with a center of the second conductive portion.

Another embodiment of the present disclosure provides a semiconductor apparatus, comprising: a first semiconductor device having a first conductive portion and a first dielectric portion adjacent to the first conductive portion; and a second semiconductor device having a second conductive portion and a second dielectric portion adjacent to the second conductive portion. The first conductive portion is directly bonded to the second conductive portion substantially in the absence of a solder material between the first conductive portion and the second conductive portion, and the first dielectric portion is directly bonded to the second dielectric portion.

In some embodiments, a coefficient of thermal expansion of the first conductive portion is higher than that of the first dielectric portion.

In some embodiments, the first semiconductor device and the second semiconductor device are vertically bonded, and the first conductive portion contacts the second conductive portion substantially in the absence of a lateral protrusion into an interface between the first dielectric portion and the second dielectric portion.

In some embodiments, a center of the first conductive portion is aligned with a center of the second conductive portion.

Another embodiment of the present disclosure provides a method for preparing a semiconductor apparatus, including: forming a first semiconductor device having a first conductive portion, a first dielectric portion adjacent to the first conductive portion, and a depression at an upper surface of the first conductive portion; forming a second semiconductor device having a second conductive portion and a second dielectric portion adjacent to the second conductive portion; disposing the first semiconductor device and the second semiconductor device in a manner such that the first conductive portion faces the second conductive portion; and expanding at least one of the first conductive portion and the second conductive portion to fill the depression.

In some embodiments, the forming of the first semiconductor device comprises: forming a first dielectric layer over a semiconductor substrate; forming an opening in the first dielectric layer; and forming the first conductive portion in the opening.

In some embodiments, the forming of the first conductive portion in the opening comprises: forming a conductive layer over the first dielectric layer and filling the opening; performing a planarization process to remove a portion of the conductive layer from an upper surface of the first dielectric layer; and performing a selective etching process to remove an upper portion of the conductive layer in the opening to form the depression.

In some embodiments, the forming of the first conductive portion in the opening comprises: forming a conductive layer over the first dielectric layer and filling the opening; performing a first planarization process to remove a portion of the conductive layer from an upper surface of the first dielectric layer; forming a mask covering the conductive layer in the opening; forming a second dielectric layer over first dielectric layer and covering the mask; performing a second planarization process to remove a portion of the second dielectric layer and expose the mask; and removing the mask to form a depression.

In some embodiments, a coefficient of thermal expansion of the first conductive portion is higher than that of the first dielectric portion, and expanding at least one of the first conductive portion and the second conductive portion comprises performing a thermal treating process that expands a thickness of the first conductive portion more than a thickness of the first dielectric portion.

In some embodiments, the first conductive portion, having the depression, is formed at a first temperature, and the thermal treating process heats at least one of the first conductive portion and the second conductive portion to a second temperature higher than the first temperature.

In some embodiments, the depression separates the first conductive portion from the second conductive portion, and the first dielectric portion contacts the second dielectric portion.

The present disclosure is directed to a semiconductor apparatus having a plurality of bonded semiconductor devices formed by a fusion bonding technique and a method for preparing the same. The semiconductor devices have conductive portions with higher coefficient of thermal expansion than their dielectric portions. By forming the depression to provide a space for the volume expansion of the conductive portion with higher coefficient of thermal expansion during the subsequent thermal treating process of the fusion bonding, the semiconductor apparatus formed of semiconductor devices by the fusion bonding technique does not exhibit a lateral protrusion into the interface between the two dielectric portions. As a result, the failure of the electrical function due to lateral protrusion is effectively eliminated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 1 is a cross-sectional view showing the transforming of a semiconductor device via application of heat in accordance with a comparative embodiment of the present disclosure.

FIG. 3 is a cross-sectional view showing the transforming of a semiconductor device via application of heat in accordance with some embodiments of the present disclosure.

FIG. 4 is a cross-sectional view showing the transforming of a semiconductor device via application of heat in accordance with some embodiments of the present disclosure.

DETAILED DESCRIPTION

Figure 2:
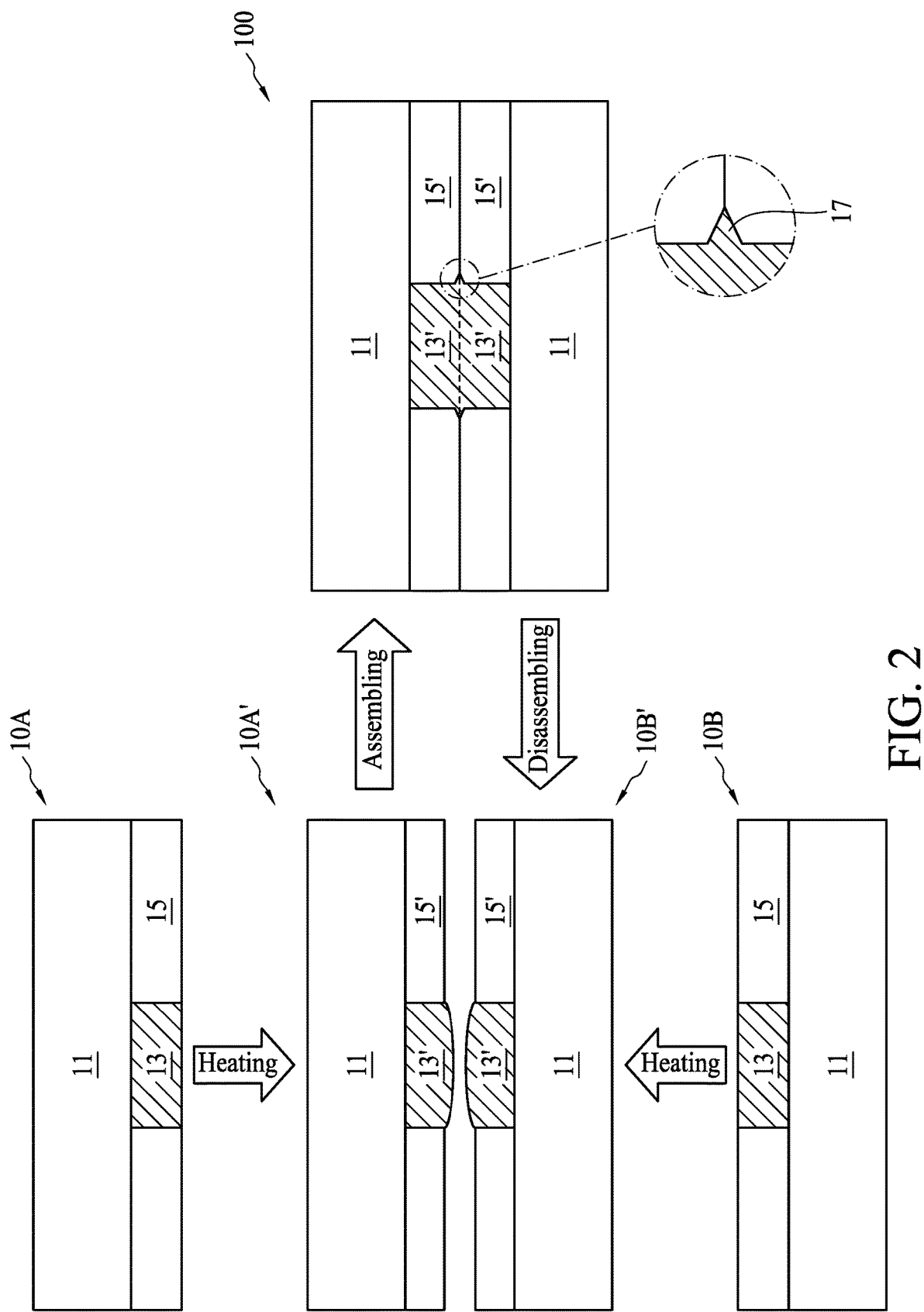
FIG. 2 is a cross-sectional view of a semiconductor apparatus in accordance with a comparative embodiment of the present disclosure.

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor apparatus having a plurality of bonded semiconductor devices formed by a fusion bonding technique and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

FIG. 1 is a cross-sectional view showing the transforming of a semiconductor device 10A into a semiconductor device 10A' in accordance with a comparative embodiment of the present disclosure. The semiconductor device 10A includes a substrate 11, a conductive portion 13 and a dielectric portion 15 adjacent to the conductive portion 13, wherein the upper end of the conductive portion 13 is substantially at the same level as that of the dielectric portion 15 after a planarization process such as a chemical mechanical polishing process, which is widely used in fabricating semiconductor devices. In some embodiments, the substrate 11 is a silicon substrate, the conductive portion 13 is made of copper, and the dielectric portion 15 is made of silicon oxide.

The coefficient of thermal expansion of silicon is about 2.6 ppm/T, the coefficient of thermal expansion of copper is about 17.0 ppm/T, and the coefficient of thermal expansion of silicon oxide is smaller than 1.5 ppm/° C. In other words, as the temperature increases, the conductive portion 13 of copper will expand more than the dielectric portion 15 of silicon oxide. Consequently, as the semiconductor device 10A is heated, the volume (thickness) expansion of the conductive portion 13 is greater than that of the dielectric portion 15, and the upper end of the conductive portion 13' becomes higher than the upper end of the dielectric portion 15' in the semiconductor device 10A'.

FIG. 2 is a cross-sectional view of a semiconductor apparatus 100 in accordance with a comparative embodiment of the present disclosure. The semiconductor apparatus 100 is formed by applying a fusion bonding to two vertically stacked semiconductor devices 10A and 10B. In some embodiments, the semiconductor devices 10A and 10B may have the same configuration. The fusion bonding includes a thermal treating process that expands the volume (thickness) of the conductive portion 13 more than that of the dielectric portion 15; therefore, the conductive portion 13' of the semiconductor apparatus 100 generates a lateral protrusion 17 into an interface between the two dielectric portions 15' of the semiconductor apparatus 100. However, the lateral protrusion 17 may cause the semiconductor apparatus 100 to fail to perform its electrical function.

FIG. 3 is a cross-sectional view showing the transforming of a semiconductor device 20A into a semiconductor device 20A' in accordance with some embodiments of the present disclosure. The semiconductor device 20A includes a substrate 21, a conductive portion 23 and a dielectric portion 25 adjacent to the conductive portion 23, and a depression 27 above the non-planar (curvilinear) upper surface of the conductive portion 23, wherein the coefficient of thermal expansion of the conductive portion 23 is higher than that of the dielectric portion 25. In some embodiments, the substrate 21 is a silicon substrate, the conductive portion 23 is made of copper, and the dielectric portion 25 is made of silicon oxide. In some embodiments, the bottom end of the depression 27 is defined by the upper surface of the conductive portion 23, and the upper end of the depression 27 is defined by the dashed line extending from the upper end of the dielectric portion 25.

Before the thermal treating process, the upper end of the conductive portion 23 is lower than that of the dielectric portion 25, and the thickness of the conductive portion 23 is less than that of the dielectric portion 25. As the temperature increases during a thermal treating process, the conductive portion 23 of copper expands more than the dielectric portion 25 of silicon oxide. Consequently, as the semiconductor device 20A is heated, the volume (thickness) expansion of the conductive portion 23 is greater than that of the dielectric portion u) 25, the conductive portion 23 fills the depression 27, the upper end of the conductive portion 23' becomes substantially at the same level as that of the dielectric portion 25' of the semiconductor device 20A', and the thickness of the conductive portion 23 becomes substantially the same as that of the dielectric portion 25.

FIG. 4 is a cross-sectional view showing the transforming of a semiconductor device 30A into a semiconductor device 30A' in accordance with some embodiments of the present disclosure. The semiconductor device 30 includes a substrate 31, a conductive portion 33 and a dielectric portion 35 adjacent to the conductive portion 33, and a depression 37 above the planar upper surface of the conductive portion 33, wherein the coefficient of thermal expansion of the conductive portion 33 is higher than that of the dielectric portion 35. In some embodiments, the substrate 31 is a silicon substrate, the conductive portion 33 is made of copper, and the dielectric portion 35 is made of silicon oxide. In some embodiments, the bottom end of the depression 37 is defined by the upper surface of the conductive portion 33, and the upper end of the depression 37 is defined by the dashed line extending from the upper end of the dielectric portion 35.

As the temperature increases during a thermal treating process, the copper conductive portion 33 expands more than the silicon-oxide dielectric portion 35. Consequently, as the semiconductor device 30A is heated, the volume (thickness) expansion of the conductive portion 33 is greater than that of the dielectric portion 35, the conductive portion 33 fills the depression 37, and the upper end of the conductive portion 33' is substantially at the same level as the upper end of the dielectric portion 35' of the semiconductor device 30A'.

Figure 5:
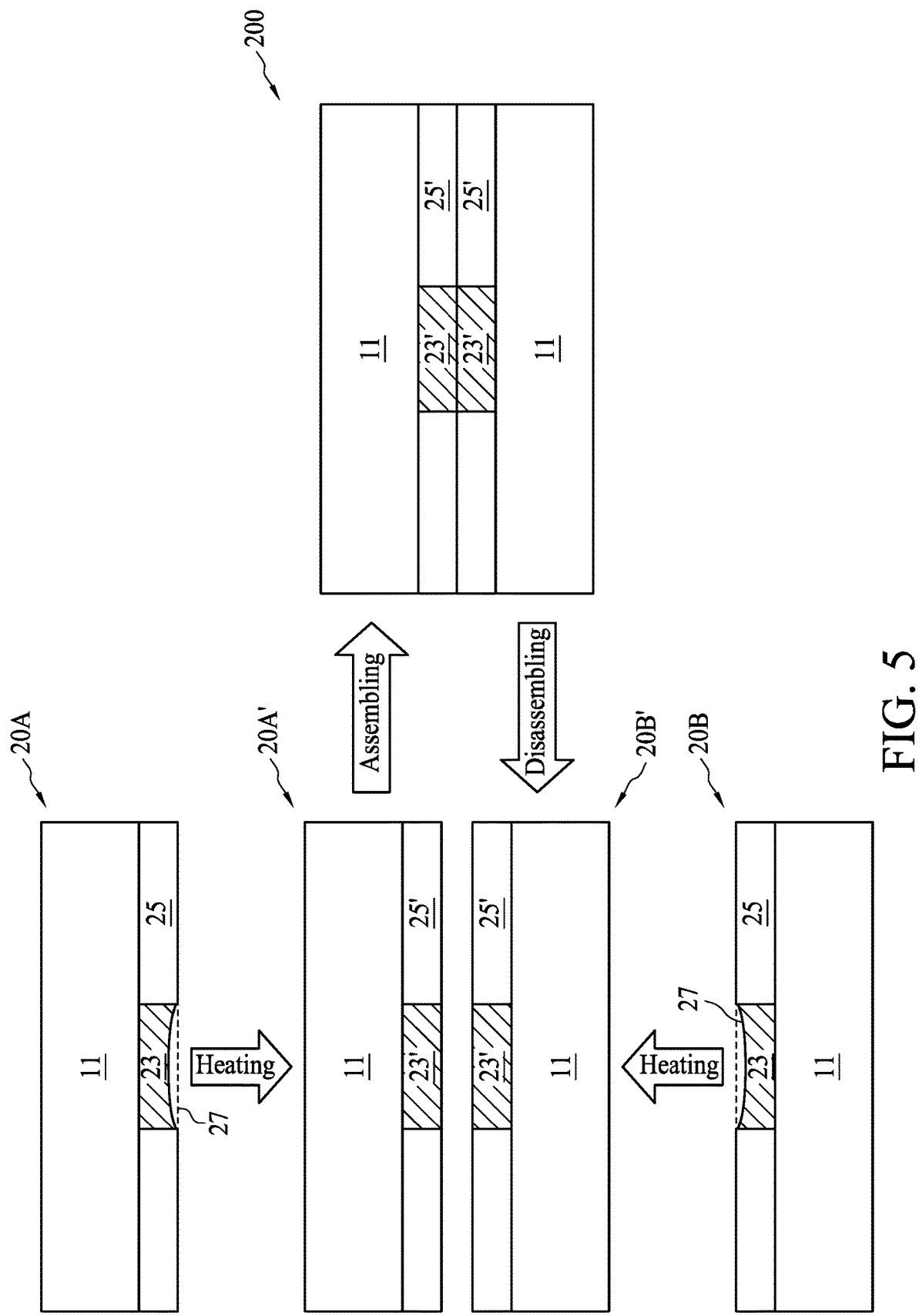
FIG. 5 is a cross-sectional view of a semiconductor apparatus in accordance with a comparative embodiment of the present disclosure.

FIG. 5 is a cross-sectional view of a semiconductor apparatus 200 in accordance with a comparative embodiment of the present disclosure. The semiconductor apparatus 200 is formed by applying a fusion bonding to two vertically stacked semiconductor devices 20A and 20B. In some embodiments, the semiconductor devices 20A and 20B may have the same configuration. The fusion bonding includes a thermal treating process that expands the volume (thickness) of the conductive portion 23 more than that of the dielectric portion 25; therefore, the conductive portion 23' of the semiconductor apparatus 200 fills the depression 27.

In some embodiments, the two semiconductor devices 20A and 20B are disposed in a manner such that the conductive portion 23 of the upper semiconductor device 20A faces the conductive portion 23 of the lower semiconductor device 20B, and the center of the conductive portion 23 of the upper semiconductor device 20A is aligned with the center of the conductive portion 23 of the lower semiconductor device 20B. Because the fusion bonding is applied, it is substantially not necessary to dispose a solder material or the like between the vertically stacked semiconductor devices 20A and 20B.

Figure 6:
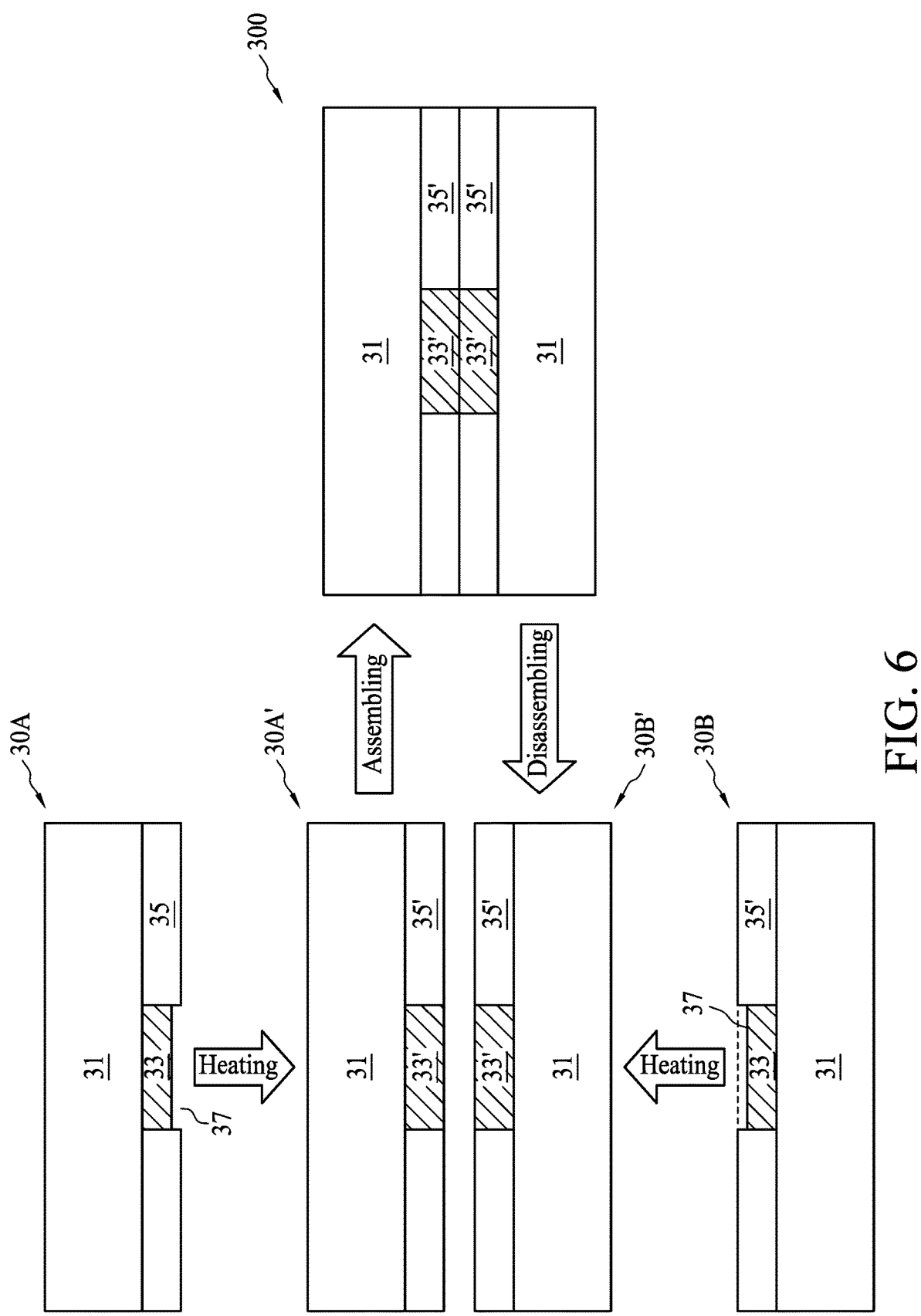
FIG. 6 is a cross-sectional view of a semiconductor apparatus in accordance with a comparative embodiment of the present disclosure.

Similarly, a semiconductor apparatus 300 can be formed by applying a fusion bonding to two vertically stacked semiconductor devices 30A and 30B, as shown in FIG. 6. Details of the fusion bonding are available in the article, An Overview of Patterned Metal/Dielectric Surface Bonding: Mechanism, Alignment and Characterization, J. Electrochem. Soc. 1011 volume 158, issue 6, P81-P86, the entirety of which is incorporated herein by reference and will not be repeated.

Figure 7:
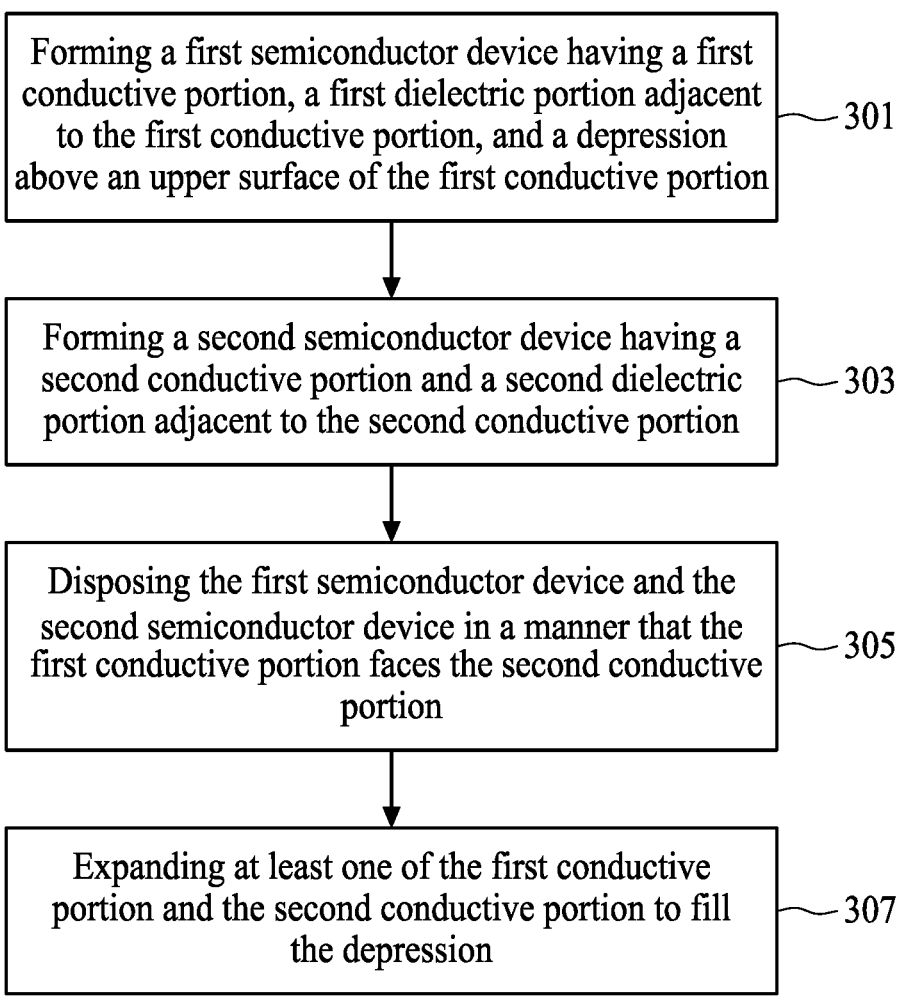
FIG. 7 is a flow chart of a method for preparing a semiconductor apparatus in accordance with some embodiments of the present disclosure.

FIG. 7 is a flow chart of a method for preparing a semiconductor apparatus in accordance with some embodiments of the present disclosure. In some embodiments, the semiconductor apparatus can be formed by a method 300 of FIG. 7. The method 300 includes a number of operations and the description and illustration are not deemed as a limitation as the sequence of the operations. The method 300 includes a number of steps (301, 303, 305, and 307).

Figure 11:
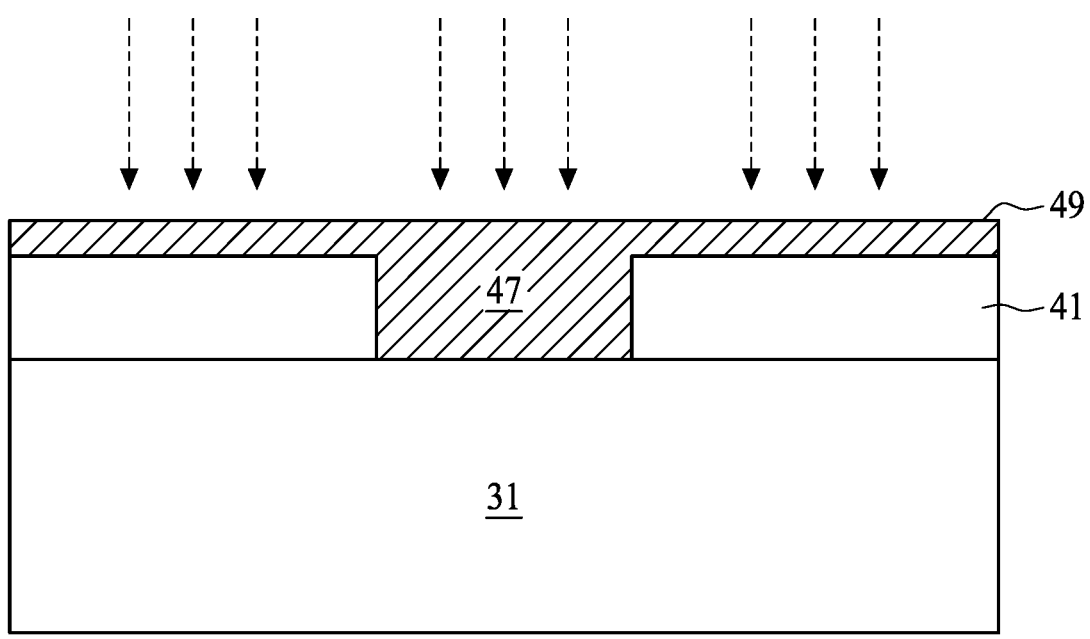
Figure 12:
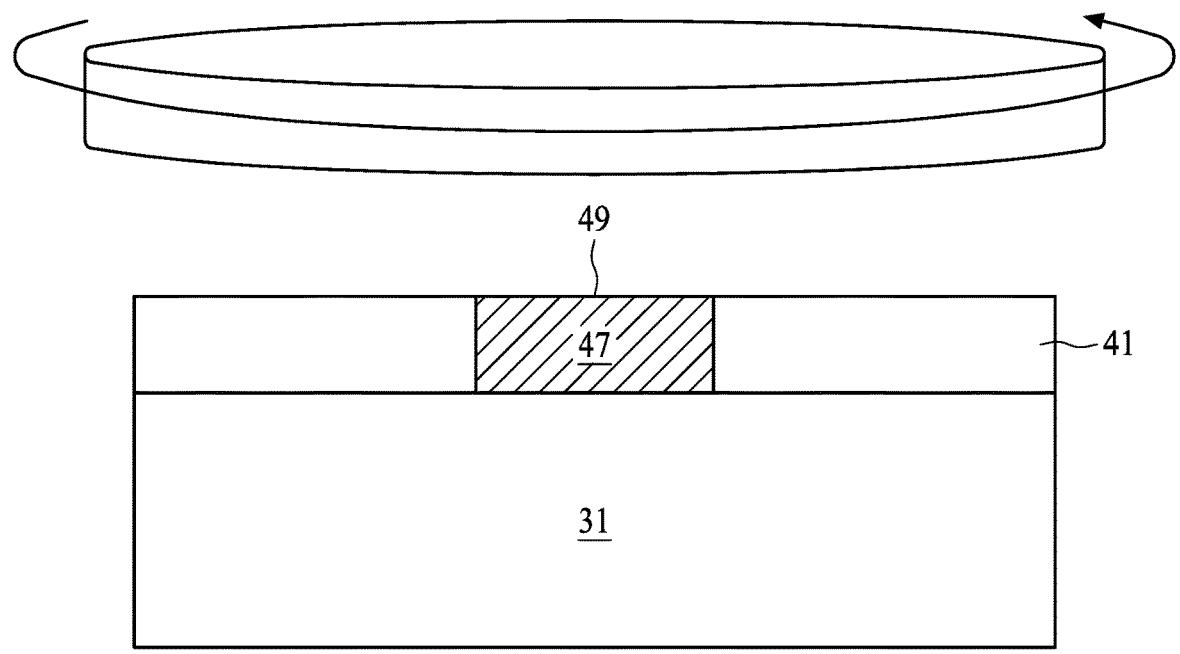
Figure 13:
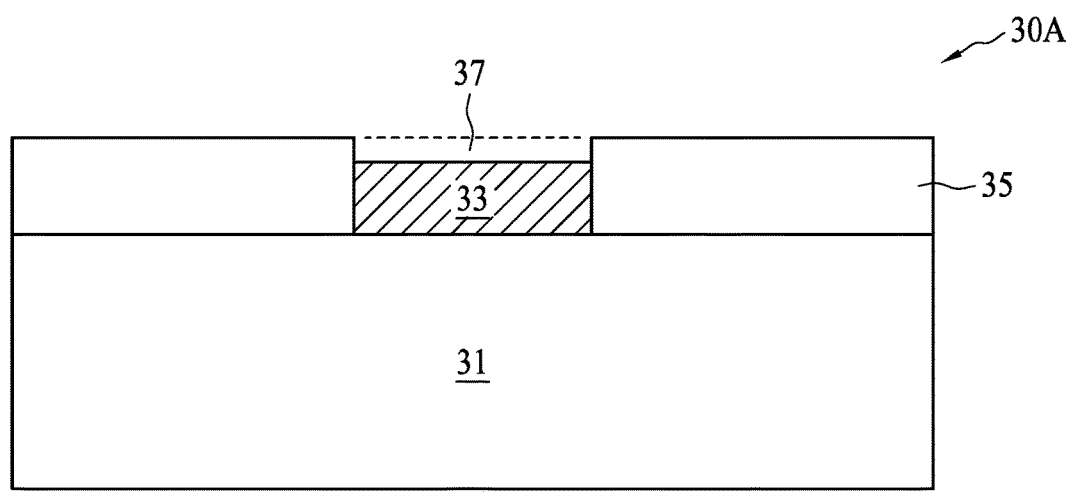

FIGS. 8 to 14 are schematic views of a process for preparing the semiconductor apparatus by the method of FIG. 7 in accordance with some embodiments of the present disclosure. In step 301, a semiconductor device 30A is fabricated as shown in FIGS. 8 to 13. In some embodiments, as shown in FIG. 13, the semiconductor device 30A has a conductive portion 33, a dielectric portion 35 adjacent to the conductive portion 33, and a depression 37 above a planar upper surface of the conductive portion 33. In some embodiments, the bottom end of the depression 37 is defined by the upper surface of the conductive portion 33, and the upper end of the depression 37 is defined by the dashed line extending from the upper end of the dielectric portion 35.

Figure 8:
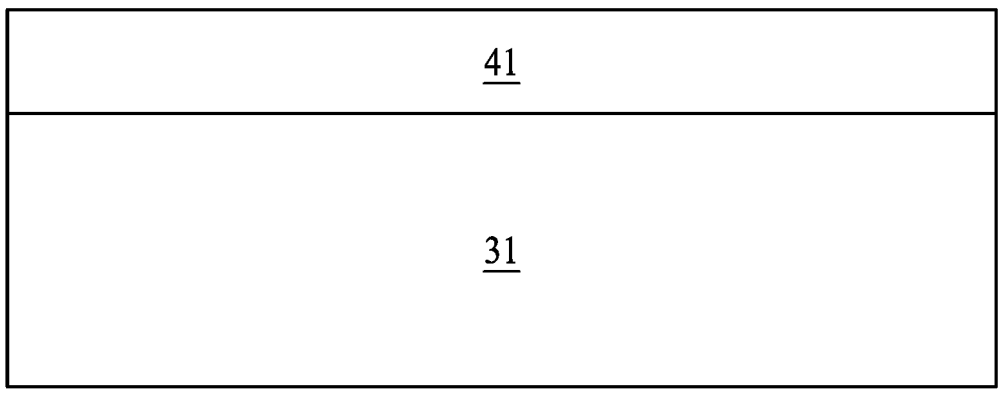
FIGS. 8 to 20 are schematic views of a process for preparing the semiconductor apparatus by the method of FIG. 7 in accordance with some embodiments of the present disclosure.

In FIG. 8, a dielectric layer 41 is formed on a substrate 31 such as a silicon substrate by performing a deposition process on the substrate 31. In some embodiments, the dielectric layer 41 is a silicon oxide layer.

Figure 9:
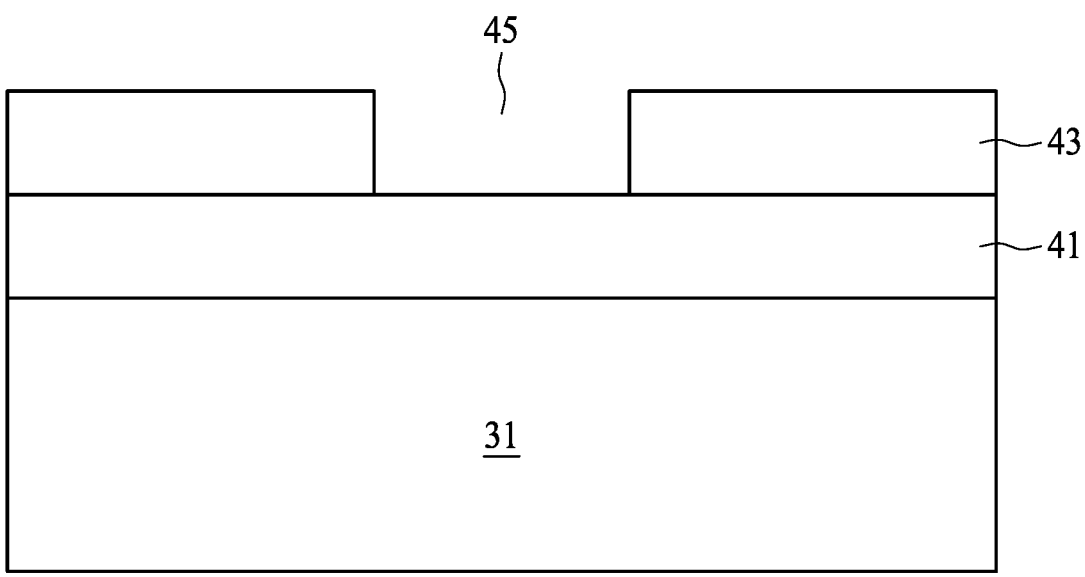

In FIG. 9, a patterned mask 43 is formed by performing deposition, lithographic and etching processes on the dielectric layer 41. In some embodiments, the patterned mask 43 is a photoresist layer having an aperture 45.

Figure 10:
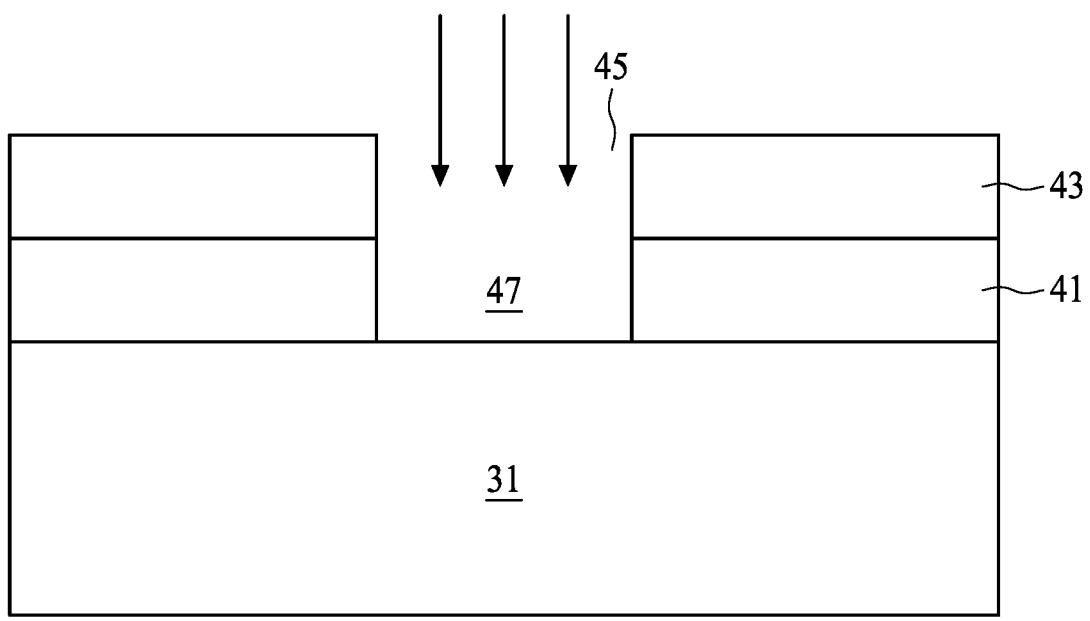

In FIG. 10, an etching process is performed by using the patterned mask 43 as an etching mask to remove a portion of the dielectric layer 31 under the aperture 45 so as to form an opening 47 in the dielectric layer 41.

In FIG. 11, the patterned mask 43 is removed, and a conductive layer 49 is formed by performing a deposition process on the substrate 31 and the dielectric layer 41, wherein the conductive layer 49 fills the opening 47 and covers the upper surface of the dielectric layer 41.

In FIG. 12, a planarization process is performed to remove a portion of the conductive layer 49 from the upper surface of the dielectric layer 41, while retaining the conductive layer 49 in the opening 47. In some embodiments, the planarization process is a chemical mechanical polishing process, and the upper end of the conductive layer 49 in the opening 47 is substantially at the same level as the dielectric layer 41 after the planarization process.

In FIG. 13, a selective etching process is performed to remove an upper portion of the conductive layer 49 in the opening 47 to form the depression 37. In some embodiments, the remaining conductive layer 49 in the opening 47 forms a conductive portion 33, the remaining dielectric layer 41 forms a dielectric portion 35 adjacent to the conductive portion 33, and the depression 37 is formed above the upper surface of the conductive portion 33. In some embodiments, the selective etching process is an anisotropic etching process such as the dry etching process, and the upper surface of the conductive portion 33 of the semiconductor device 30A is substantially planar after the anisotropic etching process.

Figure 14:
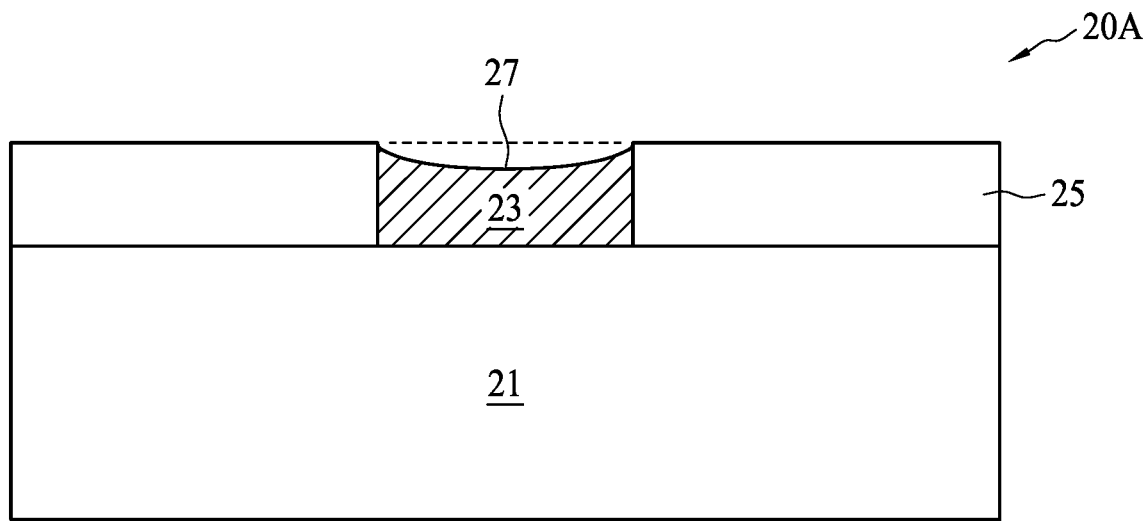

In some embodiments, referring to FIG. 14, the semiconductor device 20A can be fabricated substantially by the same fabrication processes disclosed in FIGS. 8 to 13, except for the selective etching process in FIG. 13. In some embodiments, the selective etching process for fabricating the semiconductor device 20A is an isotropic etching process such as the wet etching process, and the upper surface of the conductive portion 23 of the semiconductor device 20A is substantially non-planar (curvilinear) after the isotropic etching process.

Figure 15:
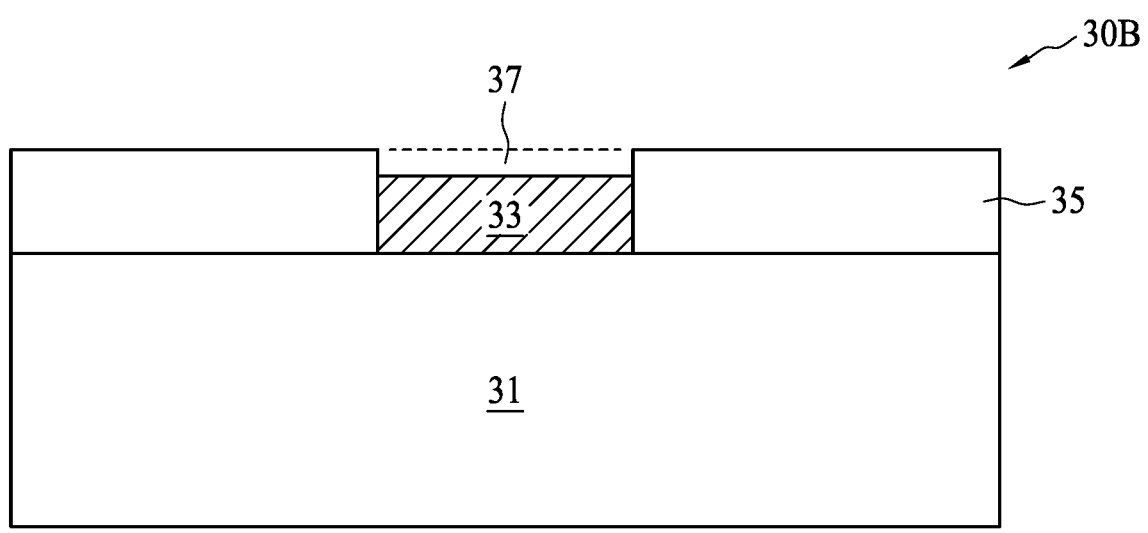

In step 303, a semiconductor device 30B is fabricated as shown in FIG. 15. In some embodiments, similar to the semiconductor device 30A, the semiconductor device 30B has a conductive portion 33 and a dielectric portion 35 adjacent to the conductive portion 33. In some embodiments, the semiconductor device 30B has a depression 37 above the upper surface of the conductive portion 33, and the fabrication of the semiconductor device 30B may be the same as that of the semiconductor die 30A shown in FIGS. 8 to 13.

Figure 16:
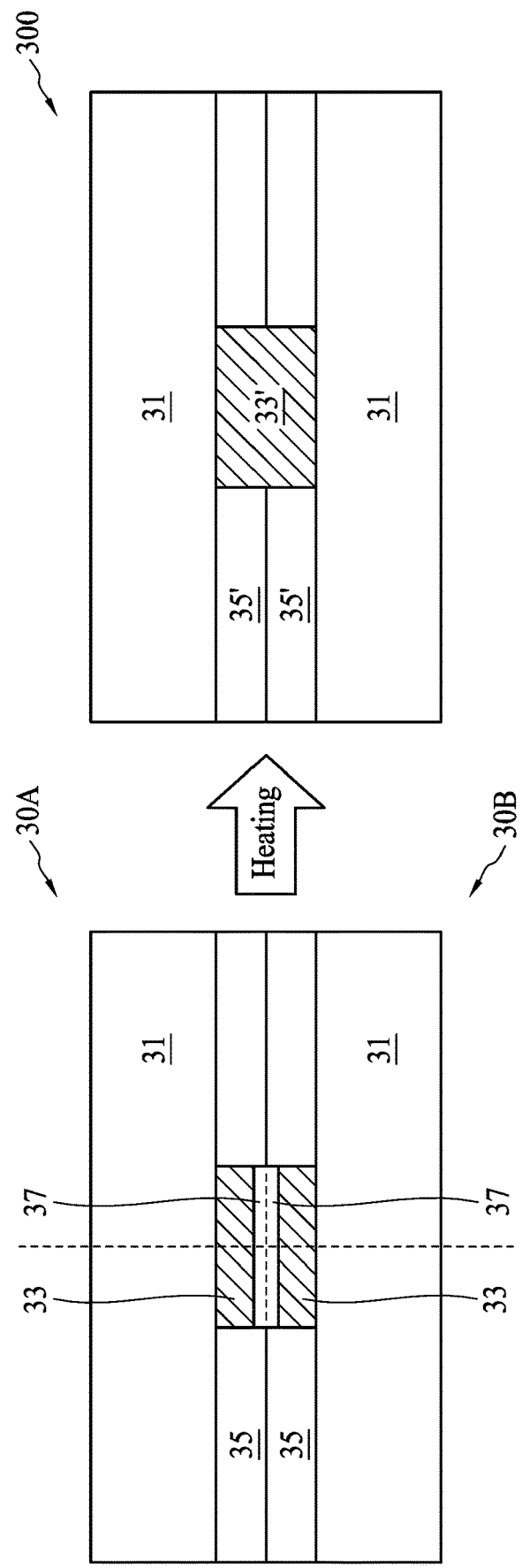

In step 305, the semiconductor device 30A and the semiconductor device 30B are assembled in a manner such that the conductive portion 33 of the semiconductor device 30A faces the conductive portion 33 of the semiconductor device 30B, as shown in FIG. 16. In some embodiments, the depression 37 separates the conductive portion 33 of the semiconductor device 30A from the conductive portion 33 of the semiconductor device 30B, and the dielectric portion 35 of the semiconductor device 30A contacts the dielectric portion 35 of the semiconductor device 30B.

In step 307, referring to FIG. 16, at least one of the conductive portion 33 of the semiconductor device 30A and the conductive portion 33 of the semiconductor device 30B is expanded to fill the depression 37; consequently, the conductive portion 33 of the semiconductor device 30A contacts the conductive portion 33 of the semiconductor device 30B to form an electrical connection. In some embodiments, the center of the conductive portion 33 of the semiconductor device 30A is aligned with the center of the conductive portion 33 of the semiconductor device 20B.

In some embodiments, the coefficient of thermal expansion of the conductive portion 33 is higher than that of the dielectric portion 35, and the expanding of the conductive portion 33 is implemented by applying the fusion bonding with a thermal treating process, which increases the volume (thickness) of the conductive portion 33 more than that of the dielectric portion 35 such that the depression 37 is filled by the conductor of the conductive portion 33. By applying the fusion bonding, it is substantially not necessary to dispose a solder material or the like between the vertically stacked semiconductor devices 30A and 30B.

In some embodiments, the conductive portion 33 defining the bottom of the depression 37 is formed at a first temperature, and the thermal treating process heats at least one of the conductive portion 33 of the semiconductor device 30A and the conductive portion 33 of the semiconductor device 30B to a second temperature higher than the first temperature. In some embodiments, the conductive portion 33 comprises copper, and the second temperature is substantially between 300° C. and 450° C.; and the first temperature is the processing temperature of the selective etching process in FIG. 13. In some embodiments, the volume of the depression 37 is substantially the same as the volume expansion of the conductive portion 33 from the first temperature to the second temperature.

The depression 37 is designed to provide a space for the volume expansion of the conductive portion 33' with higher coefficient of thermal expansion during the subsequent thermal treating process of the fusion bonding; consequently, the semiconductor apparatus 300 does not exhibit a lateral protrusion into the interface between the two dielectric portions 35'. As a result, the failure of the electrical function due to the lateral protrusion is effectively eliminated.

Figure 17:
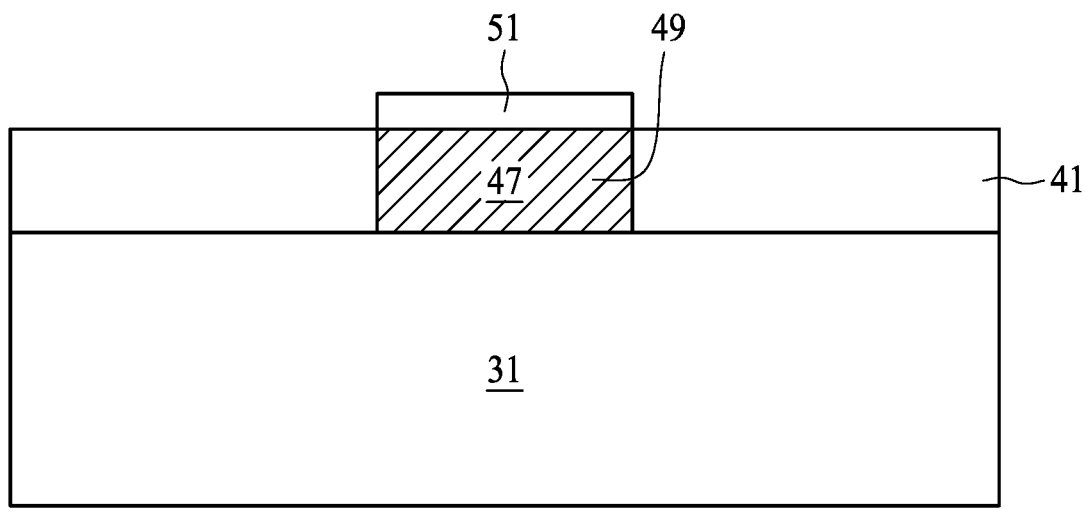

FIGS. 17 to 20 are schematic views of a process for preparing a semiconductor device 30A corresponding the step 301 in FIG. 7 in accordance with some embodiments of the present disclosure. In some embodiments, the fabrication processes disclosed in FIGS. 8 to 12 are performed, and a mask 51 is then formed by performing deposition, lithographic and etching processes on the conductive layer 49, as shown in FIG. 17. In some embodiments, the mask 51 is a patterned photoresist layer selectively covering the conductive layer 49 in the opening 47, and the upper end of the mask 51 is substantially higher than the upper end of the dielectric layer 41.

Figure 18:
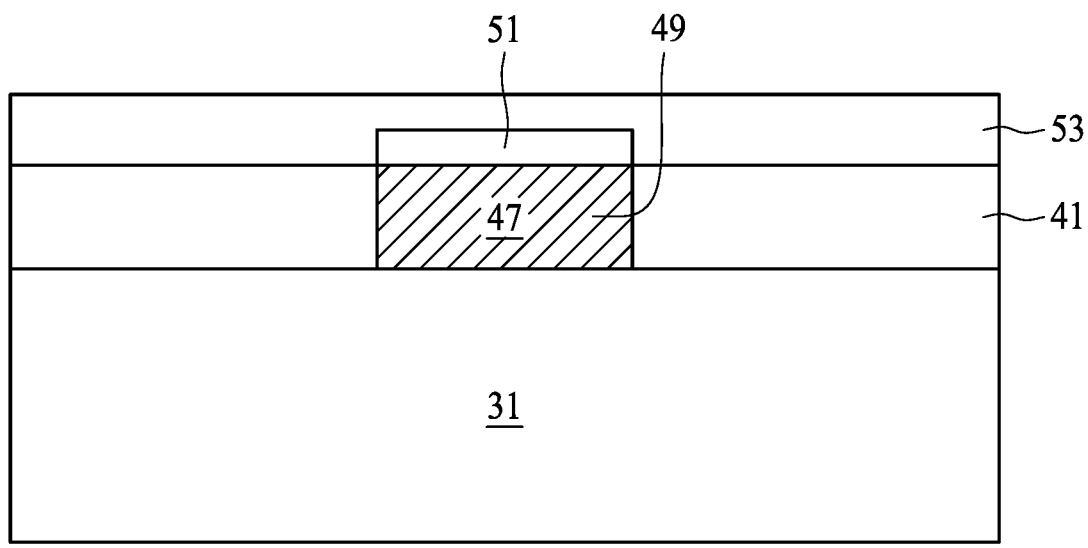

In FIG. 18, a dielectric layer 53 is formed over the dielectric layer 41 and covering the mask 51. In some embodiments, the dielectric layer 53 is made of silicon oxide, which is the same material as the dielectric layer 41.

Figure 19:
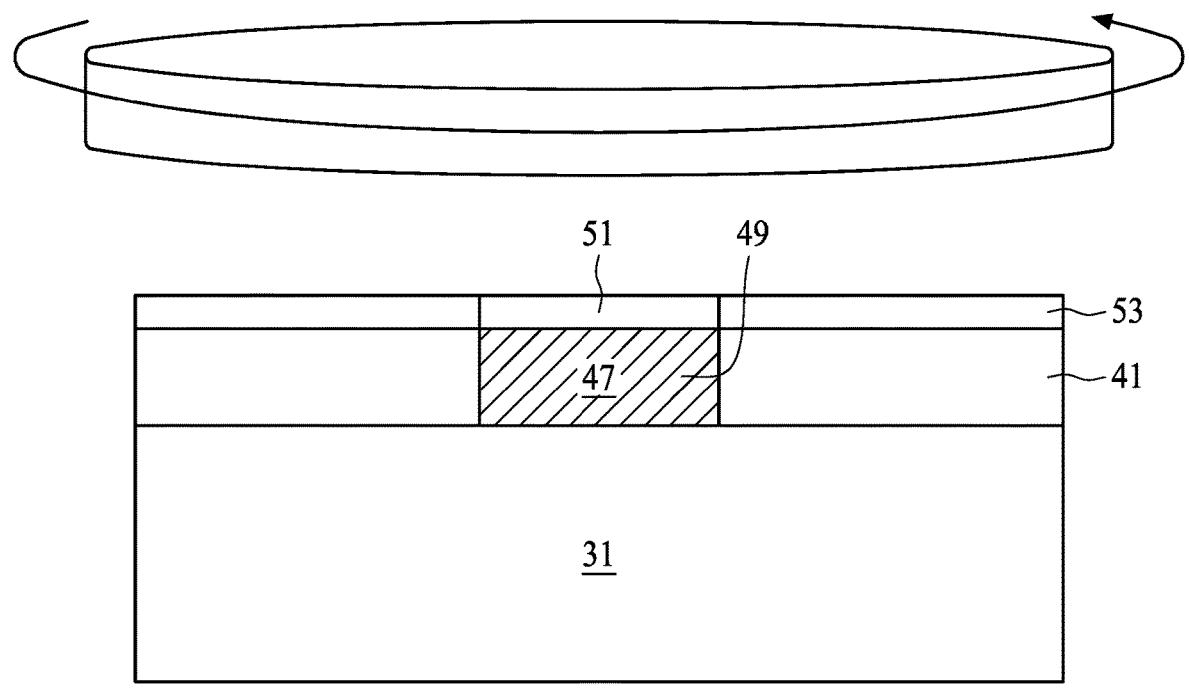

In FIG. 19, a planarization process is performed to remove an upper portion of the dielectric layer 53 and expose the mask 51. In some embodiments, the planarization process is a chemical mechanical polishing process, and the upper end of the mask 51 is substantially at the same level as that of the dielectric layer 53 after the planarization process.

Figure 20:
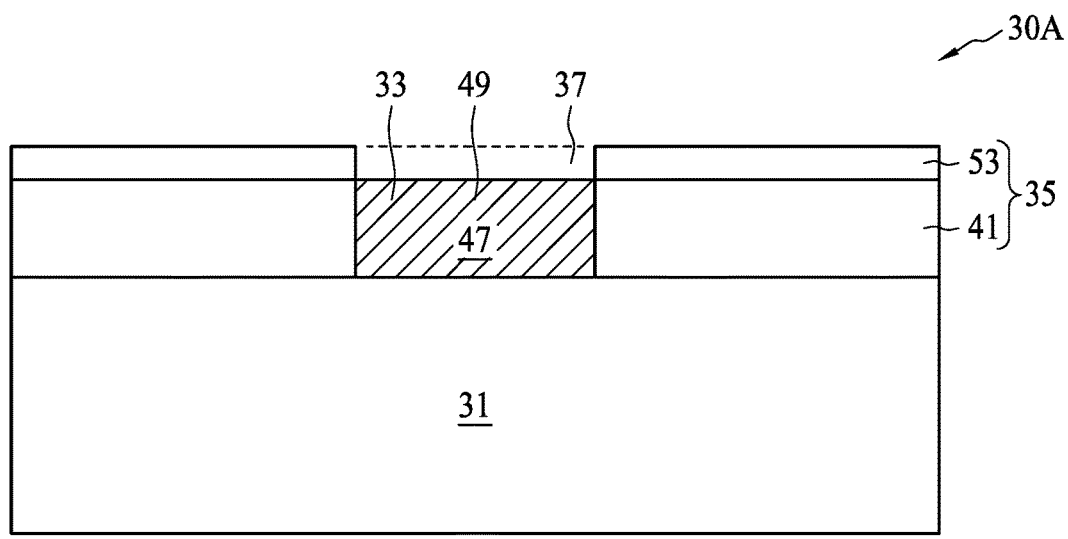

In FIG. 20, the mask 51 is removed from the conductive layer 49 in the opening 47 so as to form a depression 37 above the upper surface of the conductive layer 49 in the opening 47. Consequently, the conductive layer 49 in the opening 47 serves as the conductive portion 33 of the semiconductor device 30A, and the remaining dielectric layer 53 and the dielectric layer 41 serve as the dielectric portion 35 of the semiconductor device 30A.

The present disclosure is directed to a semiconductor apparatus having a plurality of bonded semiconductor devices formed by a fusion bonding technique and a method for preparing the same. The semiconductor devices have conductive portions with higher coefficient of thermal expansion than the dielectric portion. By forming the depression to provide a space for the volume expansion of the conductive portion with higher coefficient of thermal expansion during the subsequent thermal treating process of the fusion bonding, the semiconductor apparatus formed of semiconductor devices by the fusion bonding technique does not exhibit a lateral protrusion into the interface between the two dielectric portions. As a result, the failure of the electrical function due to the lateral protrusion is effectively eliminated.

One embodiment of the present disclosure provides a semiconductor apparatus including a first semiconductor device having a first conductive portion, a first dielectric portion adjacent to the first conductive portion, and a depression above an upper surface of the first conductive portion, wherein a coefficient of thermal expansion of the first conductive portion is higher than that of the first dielectric portion, and a volume of the depression is substantially the same as a volume expansion of the first conductive portion from a first temperature to a second temperature higher than the first temperature.

Another embodiment of the present disclosure provides a semiconductor apparatus, including: a first semiconductor device having a first conductive portion and a first dielectric portion adjacent to the first conductive portion; and a second semiconductor device having a second conductive portion and a second dielectric portion adjacent to the second conductive portion. The first conductive portion is directly bonded to the second conductive portion substantially in the absence of a solder material between the first conductive portion and the second conductive portion, and the first dielectric portion is directly bonded to the second dielectric portion.

Another embodiment of the present disclosure provides a method for preparing a semiconductor apparatus, including: forming a first semiconductor device having a first conductive portion, a first dielectric portion adjacent to the first conductive portion, and a depression at an upper surface of the first conductive portion; forming a second semiconductor device having a second conductive portion and a second dielectric portion adjacent to the second conductive portion; disposing the first semiconductor device and the second semiconductor device in a manner such that the first conductive portion faces the second conductive portion; and expanding at least one of the first conductive portion and the second conductive portion to fill the depression.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for preparing a semiconductor apparatus, comprising:
    forming a first semiconductor device having a first conductive portion, a first dielectric portion adjacent to the first conductive portion, and a depression at an upper surface of the first conductive portion;
    forming a second semiconductor device having a second conductive portion and a second dielectric portion adjacent to the second conductive portion;
    disposing the first semiconductor device and the second semiconductor device in a manner such that the first conductive portion faces the second conductive portion; and
    expanding at least one of the first conductive portion and the second conductive portion to fill the depression;
    wherein the forming of the first semiconductor device comprises:
        forming a first dielectric layer over a semiconductor substrate;
        forming a patterned mask with an aperture on the first dielectric layer;
        removing a portion of the first dielectric layer under the aperture to form an opening in the first dielectric layer;
        removing the patterned mask on the first dielectric layer; and
        forming the first conductive portion in the opening, wherein an upper surface of the first conductive portion is curvilinear and an edge of the upper surface of the first conductive portion is substantially coplanar with an upper surface of the first dielectric layer;
    wherein the forming of the first conductive portion in the opening comprises:
        forming a conductive layer over the first dielectric layer and filling the opening;
        performing a planarization process to remove a portion of the conductive layer from the upper surface of the first dielectric layer; and
        performing a selective etching process to remove an upper portion of the conductive layer in the opening to form the depression.

2. The method for preparing a semiconductor apparatus of claim 1, wherein a coefficient of thermal expansion of the first conductive portion is higher than that of the first dielectric portion, and expanding at least one of the first conductive portion and the second conductive portion comprises performing a thermal treating process that expands a thickness of the first conductive portion more than a thickness of the first dielectric portion.

3. The method for preparing a semiconductor apparatus of claim 2, wherein the first conductive portion having the depression is formed at a first temperature, and the thermal treating process heats at least one of the first conductive portion and the second conductive portion to a second temperature higher than the first temperature.

4. The method for preparing a semiconductor apparatus of claim 1, wherein the depression separates the first conductive portion from the second conductive portion, and the first dielectric portion contacts the second dielectric portion.

* * * * *